United States Patent [19]

Cohen

[11] Patent Number: 4,759,803
[45] Date of Patent: Jul. 26, 1988

[54] MONOLITHIC SOLAR CELL AND BYPASS DIODE SYSTEM

[75] Inventor: Marshall J. Cohen, Thousand Oaks, Calif.

[73] Assignee: Applied Solar Energy Corporation, City of Industry, Calif.

[21] Appl. No.: 83,529

[22] Filed: Aug. 7, 1987

[51] Int. Cl.[4] .................... H01L 25/02; H01L 31/18; H01L 31/06

[52] U.S. Cl. ................................ 136/244; 136/255; 136/262; 437/2; 437/5

[58] Field of Search ................ 136/255, 244, 262; 437/2, 5

[56] References Cited

U.S. PATENT DOCUMENTS

| 3,887,935 | 6/1975 | Fischer et al. | 136/244 |
| 3,912,539 | 10/1975 | Magee | 136/244 |
| 3,956,765 | 5/1976 | Fischer et al. | 357/30 |
| 4,481,378 | 11/1984 | Lesk | 136/244 |

FOREIGN PATENT DOCUMENTS 57-204180 12/1982 Japan ................................ 136/244

Primary Examiner—Aaron Weisstuch
Attorney, Agent, or Firm—Poms, Smith, Lande & Rose

[57] ABSTRACT

A protected solar cell including a monolithic bypass diode is formed by adding an additional layer of semiconductive material having a type opposite to the outermost semiconductive layer of a solar cell, and the resultant additional layer is cut back to form a small area bypass diode, which is subsequently connected across the solar cell by integrated circuit metallization techniques. The solar cell may be formed of gallium arsenide with the underlying semiconductive material being n-type gallium arsenide, and forming a junction with a thin layer of p-type gallium arsenide covered with a window of p-type aluminum gallium arsenide. The bypass diode is initially formed of a supplemental layer of n-type gallium arsenide, and by sucessive etching processes, an island is formed extending downward from a small area of n-type gallium arsenide through the two p-type layers. An insulating layer, which may be formed of silicon nitride, is deposited to avoid short circuiting of the output connection, and metallized connections from the bypass diode to the output circuitry of the solar cell, and to the underlying n-type layer are then completed.

18 Claims, 4 Drawing Sheets

BYPASS DIODE

SOLAR CELL

ILLUMINATED, FORWARD BIAS

SHADOWED, REVERSE BIAS

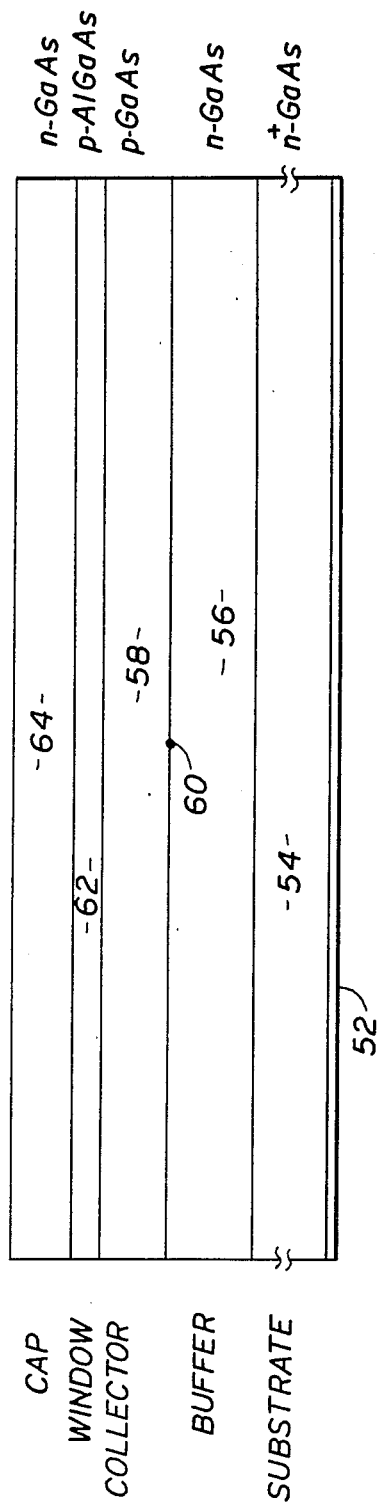
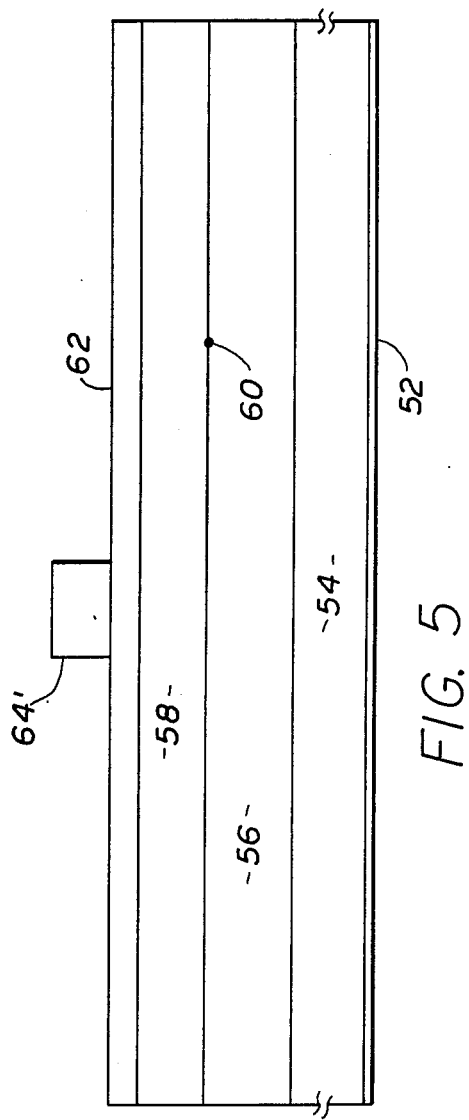

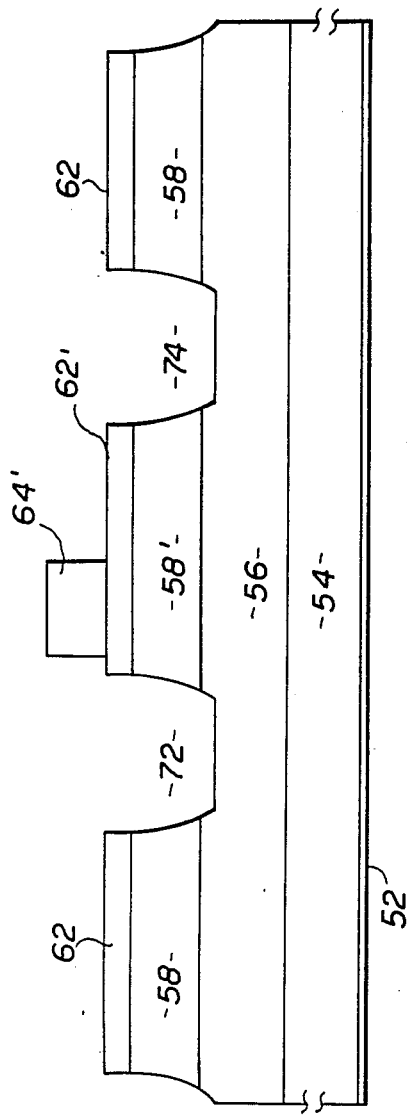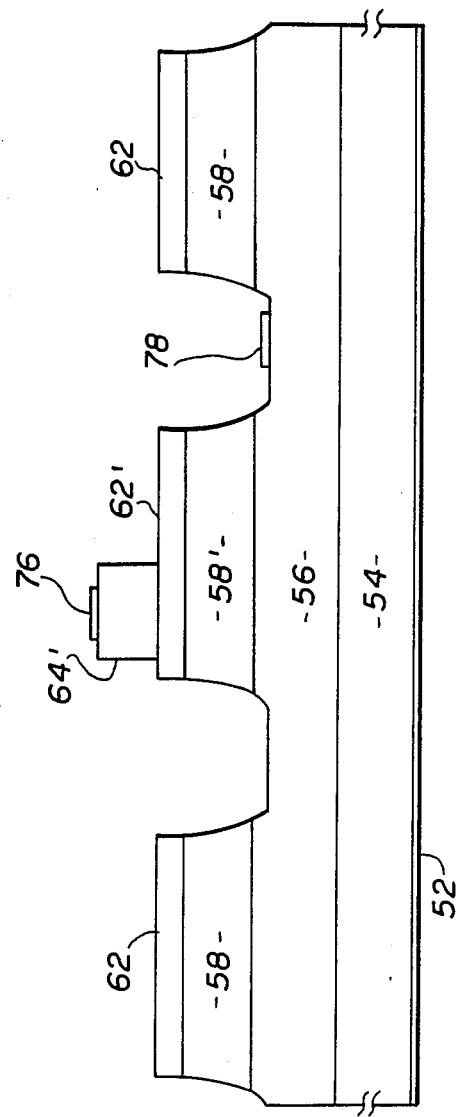

MONOLITHIC SOLAR CELL AND BYPASS DIODE SYSTEM

This invention relates to solar cell systems.

BACKGROUND OF THE INVENTION

For systems applications, solar cells are generally assembled in series strings, which are then grouped in panels. If an individual solar cell in the series-connected string is shadowed, while the remainder of the string is illuminated, the photocurrent must still flow through the shadowed photocell. In this regard it is noted that the output photocurrent from an illuminated solar cell is in the "reverse" direction or the normally non-conducting direction for the solar cell diode when it is not illuminated. When current is forced through a shadowed photocell it may be brought to the reverse breakdown point, often resulting in subsequent degradation in its performance. This problem is especially acute with gallium arsenide solar cells. To protect the cell, a bypass diode with reverse orientation may be wired in parallel with the solar cell diode. When the solar cell is shadowed, the photocurrent from the other cells in the series-connected string flows through the bypass diode in its forward direction, thus protecting the shadowed photocell. Of course, when the solar cell is not shadowed, the bypass diode is back biased and may be ignored, as long as its leakage current is low.

Separate bypass diodes are typically used to accomplish this objective, resulting in often unacceptable increases in cost complexity and weight.

An article describing an arrangement of the type described above is entitled "Solar Arrays with Integral Diodes" by R. M. Diamond and E. D. Steele, and was included in a book entitled, "Solar Cells" edited by J. F. Faugere and D. A. Nutt; Gorden and Breach Science Publshers, Ltd., 12 Bloomsburg Way, London W.C. 1, England, 1971. As described in the foregoing article, the bypass diodes were "integral" in that they were fabricated separately on the back of the silicon solar cell, but they had to be separately wired into the circuit.

Additional articles relating more generally to the technology and methods for making gallium arsenide solar cells, include the following:

1. "Overview of GaAs Solar Cell Production", by Y. C. M. Yeh et al, I.E.C.E.C., April 1984.
2. "Review of Mantech Program For GaAs Solar Cells", by P. A. Iles, Kou-I Chang and W. Pope, presented at I.E.E.E. Photovoltaic Specialists Conference, May 6-10, 1987, New Orleans, LA.
3. "Heterostructure GaAs/Ge Solar Cells", by R. K. Morris, K. I. Chang, et al., presented at I.E.E.E. Photovoltaic Specialists Conference, May 6-10, 1987, New Orleans, LA.

Thus, it has been recognized that it would be desirable to use bypass diodes in solar cell arrays, but the use of separate discrete bypass diodes greatly complicates solar cell panel assembly; and the use of the "integral" diodes requiring separate wiring connections as described in the first article cited above, has much the same disadvantages.

Accordingly, a principal object of the present invention is to provide a monolithic solar cell and bypass diode configuration which avoids the foregoing disadvantages.

SUMMARY OF THE INVENTION

In accordance with a specific illustrative embodiment of the invention, a broad area gallium arsenide solar cell including a broad p-n junction area exposed to receive radiation, with the p-type semiconductive material at the exposed surface of the cell, has an additional small area of n-type semiconductive material on a small isolated island of the p-type material, to form the reversely oriented bypass diode. Integrated circuit metallization techniques are then employed to connect the n-type bypass diode terminal to the p-type solar cell output, and the p-type bypass diode terminal to the n-type zone of the solar cell. In forming the panel assemblies, no additional electrical connections need to be made, as each of the cells is a monolithically protected solar cell.

In accordance with a broader aspect of the invention, a solar cell includes a broad area p-n junction, with a first layer of one polarity of semiconductive material exposed to or facing to receive the incoming solar radiation, and a second layer of the opposite polarity conductivity type underlying the first layer. A small island of this first layer is isolated by etching through this first layer of semiconductive material to the second layer, and semiconductive material of the opposite polarity type is formed on top of this small island to form a bypass diode. Integrated circuit deposition techniques for insulation and metallization are then employed to connect the outer area of the bypass diode to the solar cell output from the first layer of semiconductive material; and to connect the inner area of the bypass diode of the one polarity of semiconductive material to the underlying solar cell semiconductive material of the opposite polarity type.

It is noted in passing that the semi-conductor layer facing the sun or source of illumination may be a composite layer including an outer transparent or translucent semiconductive layer which may form part of the bypass diode.

The process is described in detail hereinbelow in connection with gallium arsenide solar cells. The individual cells are often formed with the cells having an area of about 2 cm by 4 cm. For such a cell, the bypass diode may be about one millimeter square. Accordingly, the radiation reception area lost to the bypass diode is minimal, substantially less than one-half percent of the active solar cell area.

Other objects, features and advantages will become apparent from a consideration of the following detailed description, and from the accompanying drawings.

BRIEF DESCRIPTION OF THE DRAWINGS

FIGS. 4 through 9 show the successive steps in the fabrication of a monolithic protected solar cell including a bypass diode, and illustrating the principles of the present invention.

DETAILED DESCRIPTION OF PREFERRED EMBODIMENT

Figure 1:
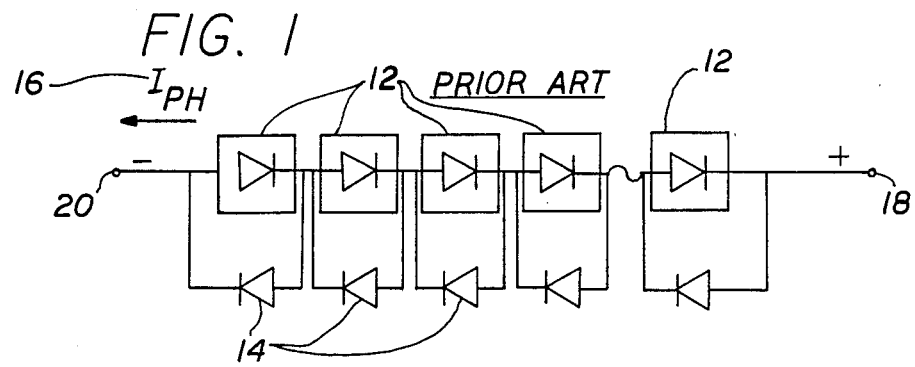
FIG. 1 is a circuit diagram showing series connected solar cells and associated bypass diodes.

Referring more particularly to the drawings, FIG. 1 shows a known type of solar cell circuit including a plurality of solar cells 12, and a plurality of bypass diodes 14. The "I" symbol 16 indicates the direction of photocurrent flow from the solar cells 12, so that the output terminal 18 is positive and the output terminal 20 is negative. Accordingly, when the solar cells 12 are illuminated by the sun, or a similar radiant energy source, the diodes 14 are back biased and are essentially out of the circuit. However, if one of the solar cells happens to be shadowed, current flow will continue through the associated bypass diode 14, so that the solar cell is not damaged by high reverse current. Incidentally, in some cases, the designer of the system may predict which solar cells are likely to be shadowed from time to time, and those specific solar cells may be provided with bypass diodes, while the other solar cells in the string need not be accompanied by parallel-connected bypass diodes.

Figure 2:
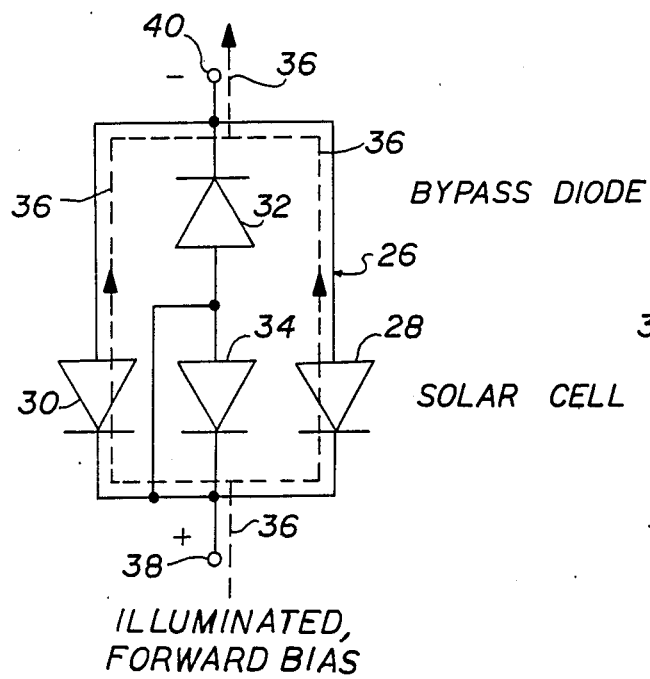
FIG. 2 is a diagrammatic showing of a solar cell and bypass diode arrangement illustrating the principles of the present invention, with the solar cell being illuminated.

FIG. 2 is a diagrammatic showing of a solar cell illustrating the principles of the present invention, showing the current flow path when the solar cell is illuminated. More specifically, the solar cell 26 of FIG. 2 includes the current generating areas indicated by the solar cell diodes 28 and 30, and the bypass diode indicated by reference numeral 32 which is mounted on top of a section of the solar cell indicated by the diode 34. Incidentally, the structure indicated schematically in FIG. 2 will be shown in considerably greater detail in connection with FIGS. 4 through 9 of the drawings.

Referring back to FIG. 2, when the solar cell 26 is illuminated, the current is generated in the portions of the solar cell indicated by the reference numerals 28 and 30 and flows as indicated by the dashed lines 36 from terminal 38 to terminal 40. The voltage on terminal 40 is negative with respect to that on terminal 38.

Figure 3:
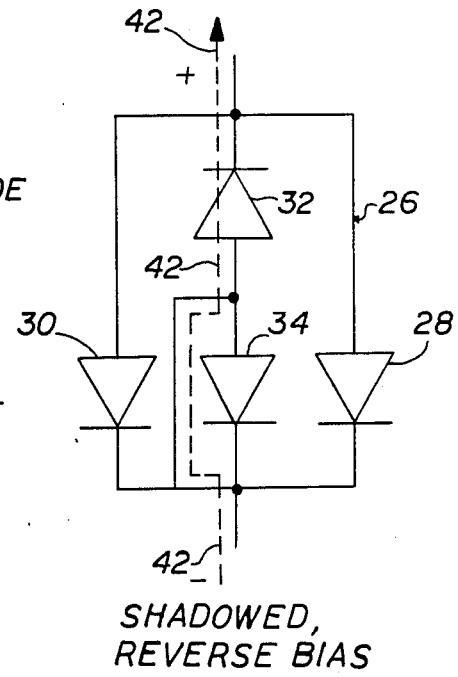
FIG. 3 is a diagram similar to that of FIG. 2, showing the current flow with the solar cell being shadowed.

FIG. 3 shows the current flow through the same protected solar cell as shown diagrammatically in FIG. 2, but with the solar cell 26 being shadowed. More specifically, with the solar cell being shadowed, no current is being generated by the main portion of the solar cell indicated by reference numerals 28 and 30. The current indicated by the dashed line 42, is being forced through the solar cell 26 by the other solar cells in the string (See FIG. 1). In the absence of the bypass diode 32, the solar cell, as indicated by reference numerals 28 and 30 would be back biased, and the reverse current or voltage applied to the solar cell could cause reverse breakdown, with the potential for permanently damaging the cell. Instead, however, with the bypass diode 32 in place, the current flows along the path indicated by the dashed line 42, and no harm can befall the shadowed solar cell 26.

We will now turn to a consideration of the steps involved in the manufacture of the solar cell including the monolithic bypass diode, in connection with FIGS. 4 through 9 of the drawings.

Initially, the techniques for manufacturing gallium arsenide solar cells per se are known, and are set forth in the articles cited hereinabove. Referring to FIG. 4, the lower surface 52 of the solar cell may be a conductive material, such as silver. The substrate 54 may be n-type gallium arsenide, and it is shown out of scale in FIG. 4, as most of the thickness of the solar cell is taken up by the substrate 54. The additional layers as shown in FIG. 4 were grown epitaxially, using known techniques such as the metal organic chemical vapor deposition technique, as described in some detail in the articles cited hereinabove. The layer 56 is n-type gallium arsenide, and the interface between layer 56 and layer 58 of p-type gallium arsenide is the junction at which the current is generated when sunlight or other similar radiation impinges on the upper surface of the solar cell. This p-n junction is designated by the reference numeral 60 in FIG. 4.

The p-type gallium arsenide layer 62, including a substantial portion of aluminum, and constituting p-type aluminum gallium arsenide, is transparent, and serves to inhibit the dissipation of some of the charges or current which is generated at the p-n junction 60. The additional layer 64 of n-type gallium arsenide is the next epitaxial layer to be deposited, and it is new, in that it is not normally present in solar cells which have been made heretofore. As disclosed below, the material in a small portion of layer 64 is employed in the formation of the monolithic bypass diode.

Incidentally, to give a general idea of the types of dimensions and thicknesses which are involved, the entire solar cell is in the order of 0.3 millimeters thick. The layer 56 may be approximately 0.0005 centimeters thick; the layer of p-type semiconductive material 58 may be in the order of 0.00005 centimeters thick; the layer 62 may be in the order of 0.00001 centimeters thick; and the top layer 64, which will be employed in the fabrication of the bypass diode, may be approximately 0.00002 centimeters thick.

Now, turning to FIG. 5, by a conventional resist coating and etch process, most of the top layer 64 has been removed leaving only the small area designated 64' in FIG. 5.

FIG. 6 shows the mesa etch step by which the areas 72 and 74 are etched away, leaving an island approximately 1 millimeter square, including the remaining portions of the layers, designated 64', 62' and 58', by reference to their associated complete layers as shown in FIG. 4.

FIG. 7 shows the addition of the two metal contact pads 76 and 78 which are applied as one of the steps toward including the bypass diode into the solar cell on a monolithic basis.

Figure 8:
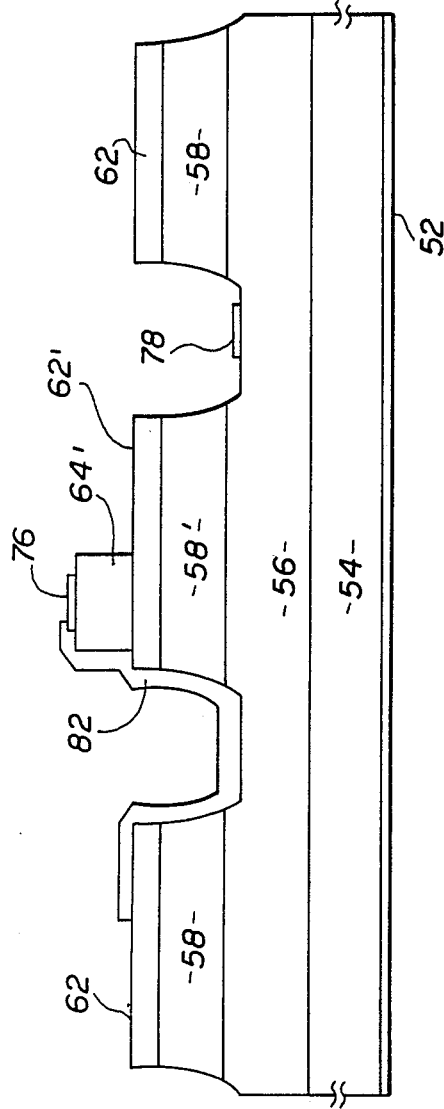

FIG. 8 shows the addition of the dielectric or insulating layer 82, which may, for example, be formed of silicon nitride.

Figure 9:
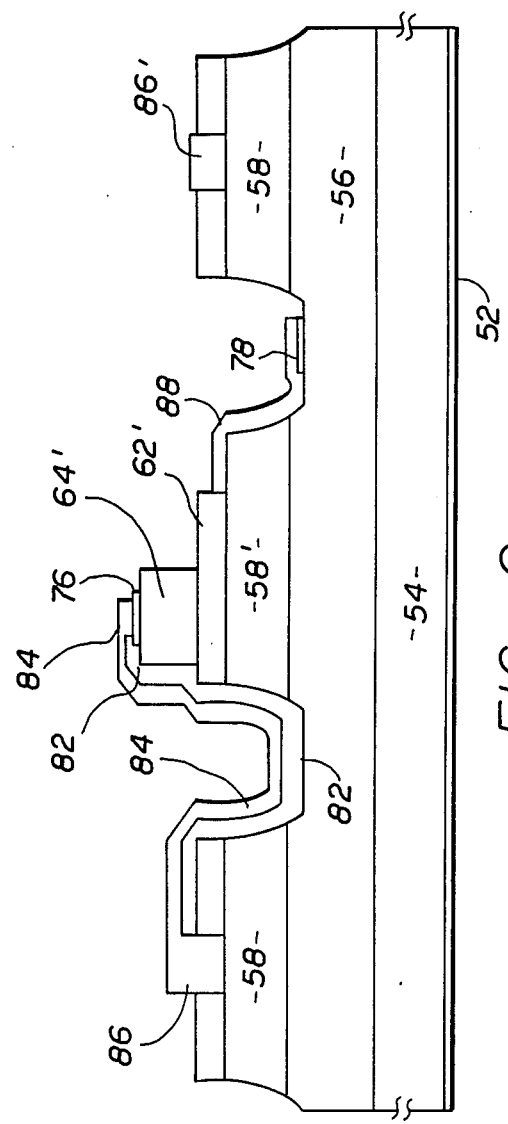

FIG. 9 shows the final configuration of the solar cell wherein the terminal 76 of the bypass diode is connected by the metallized conductive path 84, deposited over the insulating material 82, to one of the output conductors 86 of the solar cell. Another of the output conductors 86' is shown to the right in FIG. 9. In addition, the metallized conductor 88 interconnects the conductive pad 78 to the p-type material 58' and 62' to complete the circuit for the bypass diode.

Figure 10:
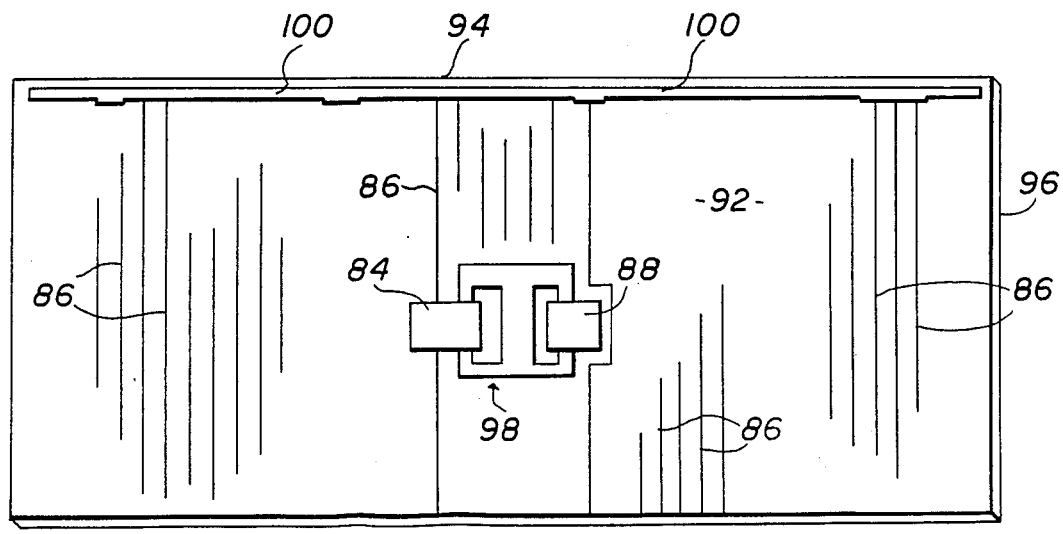
FIG. 10 shows a solar cell including a bypass diode, with the bypass diode being shown to an enlarged scale.

FIG. 10 is an overall view of a solar cell 92 which may have its longer side 94 equal to approximately 4 centimeters, and its narrower dimension 96 equal to approximately 2 centimeters. A small area 98 which might be 1 millimeter by 1 millimeter in size, and which is shown enlarged in FIG. 10, includes the bypass diode. Many fine conductive lines of conducting material 86 extend across the solar cell, and the electrical connection 84 may be observed interconnecting the diode 98 to one of the output conductors 86. The current from all of the transverse conductors 86 is picked up by the larger electrical conductor 100 and from this conductor 100, the solar cell is connected to the adjacent solar cell in the string, of the type indicated diagrammatically in FIG. 1 of the drawings.

In conclusion, it is to be understood that the foregoing detailed description and the accompanying drawings relate to one illustrative embodiment of the invention. However, the present invention may be implemented by other methods and by other structures different from those described herein above. Thus, solar cells made of other materials than gallium arsenide may be formed with monolithic bypass diodes, in accordance with the principles of this invention; and other known semiconductor processing, masking, etching, diffusion techniques, and the like may all be employed to fabricate monolithic solar cells with bypass diodes, without departing from the spirit and scope of the invention. It may also be noted that the substrate 54 as shown in FIGS. 4 through 9 need not be of n-type gallium arsenide, but could be formed of other materials. Also, the window layer 62 of a transparent p-type material could be omitted, and the n-type area 64' would then be formed directly on layer 58. Accordingly, the present invention is not limited to the embodiments precisely as shown in the drawings and as described hereinabove.

What is claimed is:

1. A protected solar cell system comprising:
   a plurality of monolithic protected solar cells electrically connected in series;
   each said monolithic protected solar cell comprising:
   (a) an underlying layer of n-type gallium arsenide semiconductive material,
   (b) a layer of p-type gallium arsenide semiconductive material overlying said n-type layer to form a p-n junction solar cell;
   (c) first and second conductive output means connected to said n-type and p-type layers, respectively;
   (d) means for isolating a small area of said p-type layer by a recess extending down to said n-type layer;
   (e) n-type semiconductive material overlying said p-type layer on said small area of p-type material to form a bypass diode;
   (f) first metallized conducting path means for connecting the n-type material of said bypass diode to said second conductive output means; and
   (g) second metallized conducting path means connecting the p-type material of said bypass diode to said underlying layer of n-type material.

2. A protected solar cell system as defined in claim 1 wherein an additional window layer of p-type aluminum gallium arsenide overlies each said layer of p-type gallium arsenide, and said n-type overlying semiconductive material is on p-type material formed of said aluminum gallium arsenide.

3. A protected solar cell system as defined in claim 1 wherein each said solar cell includes a substrate of n-type gallium arsenide.

4. A protected solar cell system as defined in claim 1 wherein each said solar cell is epitaxially formed.

5. A protected solar cell system as defined in claim 1 wherein each said solar cell is provided with a conductive layer underlying said layer of n-type gallium arsenide.

6. A protected solar cell system as defined in claim 1 including silicon nitride insulating material in layer form on the surface of each said monolithic cell to electrically isolate said second metallized conductive path means from the semiconductive layers, intermediate the ends of said conductive path.

7. A monolithic protected solar cell comprising:
   (a) a first underlying layer of semiconductive material of a first polarity type;
   (b) a second layer of semiconductive material of the second polarity type overlying said first layer to form a p-n junction solar cell;
   (c) first and second conductive output means connected to said first and second semiconductive layers, respectively;
   (d) means for isolating a small area of said second layer by a recess extending down to said first layer;
   (e) semiconductive material of said first polarity type overlying said second layer on said small area to form a bypass diode;
   (f) metallized conducting path means for connecting the semiconductive material of said first polarity type of said bypass diode to said second conductive output means; and
   (g) metallized conducting means connecting the semiconductive material of said second polarity type of said bypass diode to said underlying layer.

8. A monolithic protected solar cell as defined in claim 7 wherein an additional window layer of transparent semiconductive material of said second polarity type overlies said second layer of semiconductive material.

9. A monolithic protected solar cell as defined in claim 7 wherein said solar cell is epitaxially formed.

10. A method of forming monolithic protected solar cells comprising the steps of:
    forming a first layer of semiconductive material of a first polarity type;
    forming a second layer of semiconductive material of the second polarity type overlying said first layer to form a p-n junction solar cell;
    forming an additional layer of semiconductive material of said first polarity type on one small area of said second layer;
    isolating and forming a bypass diode by removing a portion of said second layer of semiconductive material to form a recess extending entirely around said small area on which said additional layer is located and extending to said first layer;
    providing metallic output conductive means connected to said second layer;
    applying a layer of insulating material extending from said additional layer of said bypass diode across the surface of said recess to said metallic output means;
    connecting said additional layer of said bypass diode to said output conductive means by a metallized conductive layer overlying said insulating material; and
    connecting said second layer of said bypass diode by a metallized conductive layer to said first layer of semiconductive material.

11. A method as defined in claim 10 wherein said layers of semiconductive material are epitaxially grown.

12. A method as defined in claim 10 wherein said layers of semiconductive material are formed of gallium arsenide.

13. A method as defined in claim 12 wherein a transparent window layer of aluminum gallium arsenide is applied over said second layer.

14. A method as defined in claim 13 wherein said layers of semiconductive material are formed of gallium arsenide by metal organic chemical deposition.

15. A method as defined in claim 10 wherein said recess is etched.

16. A method as defined in claim 10 wherein said insulating layer is formed by the deposition of silicon nitride.

17. A method as defined in claim 10 wherein said connecting steps are accomplished by the deposition of a layer of metal.

18. A method as defined in claim 10 wherein the output conductive means are provided in the form of a plurality of very thin electrical conductors extending across the surface of the solar cell.

* * * * *